(12) United States Patent
Messick et al.

(10) Patent No.: US 6,586,746 B1
(45) Date of Patent: Jul. 1, 2003

(54) MULTIPOLE ELECTROSTATIC E-BEAM DEFLECTOR

(75) Inventors: Scott A. Messick, Pleasant Valley, NY (US); Joseph J. Senesi, Poughquag, NY (US); Maris A. Sturans, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 226 days.

(21) Appl. No.: 09/670,728

(22) Filed: Sep. 27, 2000

(51) Int. Cl.[7] .............................................. H01J 37/147
(52) U.S. Cl. ................................. 250/396 R; 250/398
(58) Field of Search ................................ 250/396, 295, 250/396 R, 292; 445/67, 49, 46

(56) References Cited

U.S. PATENT DOCUMENTS 5,770,862 A * 6/1998 Ooaeh et al. ........... 250/396 R

* cited by examiner

Primary Examiner—John R. Lee
Assistant Examiner—James J Leybourne
(74) Attorney, Agent, or Firm—Whitham, Curtis & Christofferson, P.C.; Jay H. Anderson

(57) ABSTRACT

Forming poles from sectors of a tube of carbon or a material with similar conductive properties and supporting the poles by bonding an insulating support ring thereto before removing end rings formed at the ends of the tube which temporarily support the poles provides a multipole deflector element of robust structure of high dimensional accuracy and stability in which eddy current and charging effects are avoided. The manufacturing method is much simplified, reduced in cost and increased in reliability, repeatability and yield over manufacturing techniques for known multipole deflectors.

12 Claims, 4 Drawing Sheets

MULTIPOLE ELECTROSTATIC E-BEAM DEFLECTOR

BACKGROUND OF THE INVENTION

1. Field of the Invention

The present invention generally relates to devices employing charged particle beams and, more particularly, to arrangements for precision deflection of electron beams.

2. Description of the Prior Art

It is well-known that a beam of charged particles can be deflected by imposing an electrostatic field across the beam path. Such electrostatic deflection has been employed, for example, in cathode ray tubes using orthogonally oriented pairs of plates which can be oppositely charged to deflect an electron beam substantially as desired.

However, such plates must be placed within the evacuated chamber in close proximity to the beam and are thus subject to several deleterious effects including heating, dimensional changes and damage from impingement of the beam as well as having materials deposited thereon or reacting therewith. The angle of beam deflection is also limited and significant distortions are produced as the limit of deflection is approached. Capacitance of the plates also limits the speed with which a change in deflection can be achieved. Solid metal plates can be used only in areas of the electron beam column where there are no dynamic magnetic fields present (i.e. deflection yokes, alignment coils, dynamic focus coils and stigmatism correctors and the like) that create eddy currents which affect deflection speed and positional accuracy. For all practical lithography tools, the superposition of one or more of these fields is required.

Nevertheless, as precision and resolution of cathode ray tubes, electron beam lithography tools, electron microscopes and the like have increased and necessary departures from ideal geometry of magnetic deflection systems have become more significant, electrostatic deflection arrangements for fine high speed adjustment of electron beam trajectory has been introduced. Fine adjustments which are found to be desirable may also be best achieved by use of more than two pairs of electrostatic poles placed other than orthogonally to each other. Such arrays of electrostatic poles are generally referred to as multipole deflectors.

An example of a multipole deflector is disclosed in IBM Technical Disclosure Bulletin Vol. 30, No. 6, pp. 27–28 (November 1987) which is hereby fully incorporated by reference. This publication acknowledges that extremely high dimensional accuracy is required which is difficult to achieve. This problem and the problem of development of eddy currents is approached by forming the multipole deflector from a tube of insulating material having a low coefficient of thermal expansion such as quartz or ceramic, cutting axial slots in the tube less than the full length thereof to leave a continuous wall around each end of the tube for holding the poles in position. The slotted tube is then plated with a non-reactive (to avoid oxide formation and subsequent charging problems) conductor material such as gold, removing the plating at the ends of the tube to electrically separate the poles and installing grounding caps at the ends of the tube where plating was removed to prevent charging.

While this structure provided results superior to other arrangements using individually stacked poles, the process of making this multipole deflector was difficult and unreliable due to coating defects which affected the beam although not readily apparent from inspection and/or testing. Further, eddy currents in the thin plating layer, while significantly reduced, were not fully suppressed and some charging effects not fully remedied by the grounding caps were encountered.

In summary, no multipole deflector structure is known which is mechanically robust and dimensionally stable that can be repeatably and reliably manufactured with extremely high dimensional accuracy by a practical method and which is free from both eddy current effects and charging effects which have required use of materials having radically differing conduction properties. That is, eddy current suppression has required use of insulating materials which are subject to charging and suppression of charging effects and provision of well-regulated electrostatic fields requires conductors which are subject to eddy currents. While eddy currents may be suppressed to a significant degree by formation of extremely thin conductors such as plated gold, such thin coatings are subject to irregularities and non-uniformities which can affect the beam and the function of the conductor to deflect the beam.

Thus, no known multipole deflector arrangement has been found fully satisfactory to allow the development of the positional accuracy of which current charged particle beam systems are otherwise capable. Moreover, the known multipole deflector arrangement providing the currently highest level of performance requires a complex and difficult manufacturing process in which development of regions potentially subject to charging effects cannot be avoided and in which there is a trade-off regarding conductor thickness for suppressing eddy current effects and developing conductor films of adequate uniformity.

SUMMARY OF THE INVENTION

It is therefore an object of the present invention to provide a multipole deflector arrangement which is mechanically robust and can be easily and economically manufactured with high dimensional accuracy and stability and which is not subject to charging or eddy current effects.

It is another object of the invention to overcome problems of reliable manufacture and susceptibility to charging and eddy current effects of multipole deflectors made from insulating tubes with thin conductive coating(s).

In order to accomplish these and other objects of the invention, a multipole deflector element and charged particle beam tool including the same are provided wherein the multipole element comprises a plurality of poles in the form of sectors of a tube formed from a conductive material having a bulk material resistivity of 1000 microohm-cm or greater, said poles being supported by an insulating collar.

In accordance with another aspect of the invention, a method of forming a multipole deflector element for a particle beam tool is provided including the steps of cutting slots between but not reaching ends of a tube of conductive/resistive material parallel to an axis of the tube to form sectors connected by end rings, bonding a ring of insulating material to the sectors between said end rings, and removing the end rings.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
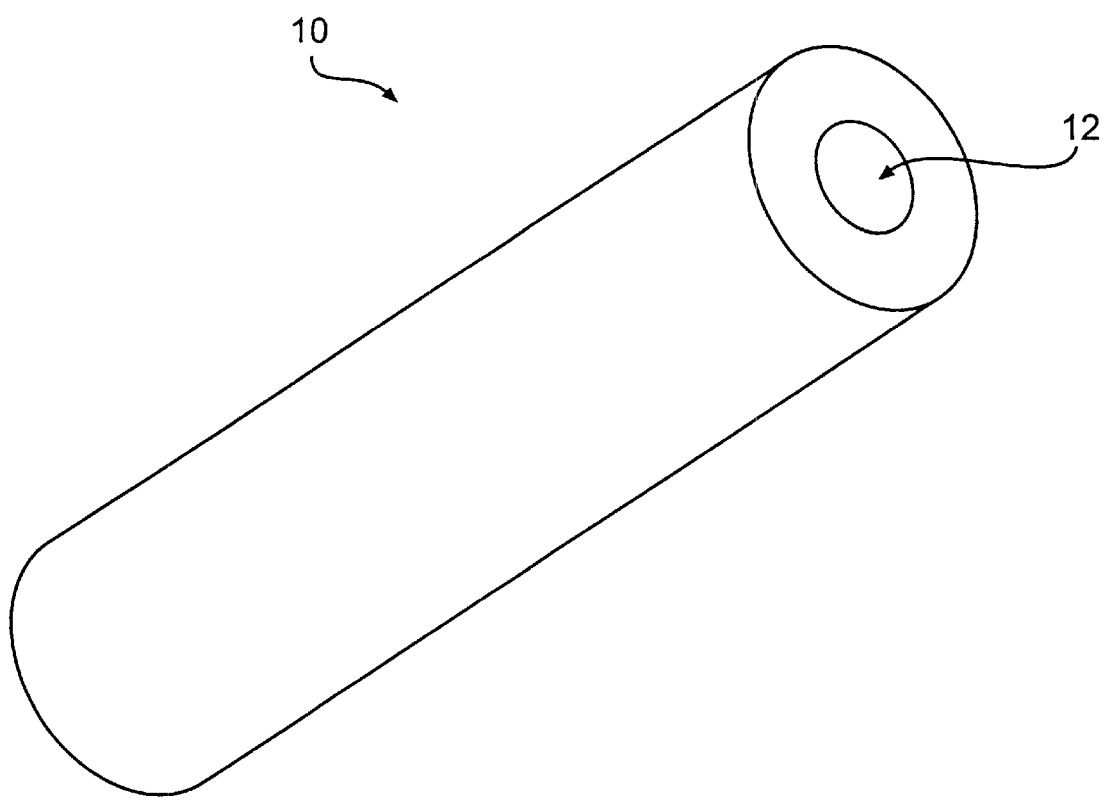
FIG. 1 is a perspective view of a raw carbon tube from which the multipole deflector in accordance with the invention is formed.

Referring now to the drawings, and more particularly to FIG. 1, there is shown, in perspective view, a raw carbon tube from which the multipole deflector in accordance with the invention is manufactured. The tube should have, or can be milled, drilled or turned on a lathe to have a bore 12 of the desired diameter to accommodate the diameter of the charged particle beam and the desired amount of deflection. A cylindrical bore is preferred for uniformity of electrostatic field but other bore shapes (e.g. conical, exponential, etc.) are possible, depending on application.

Figure 2:
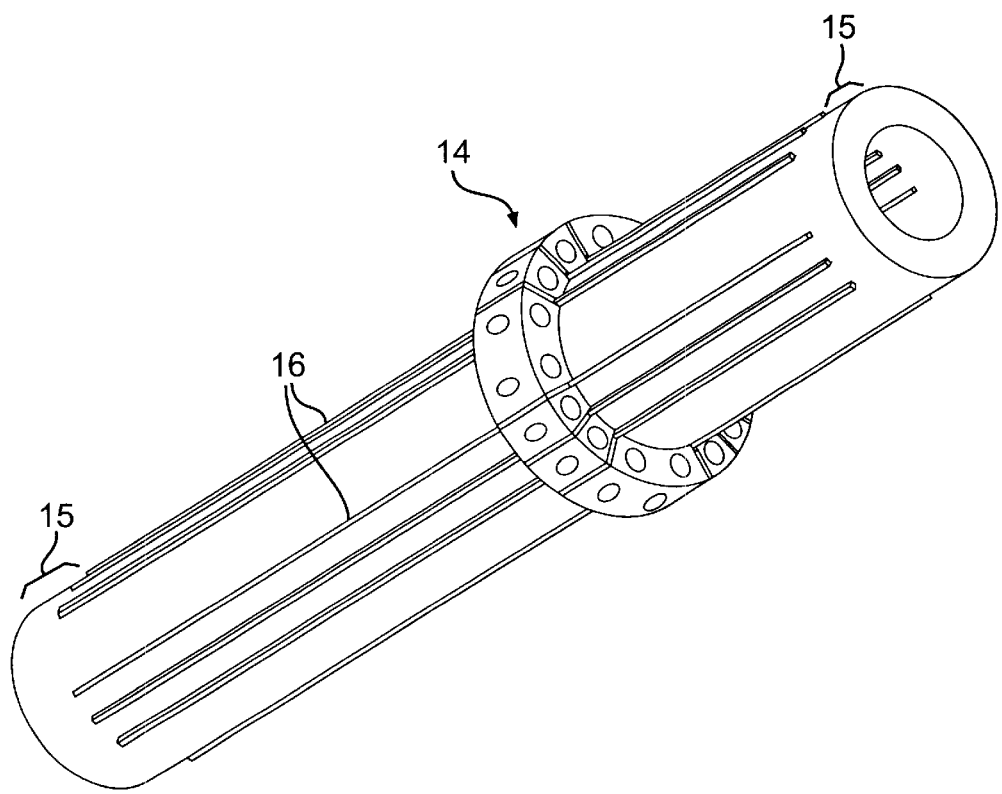
FIGS. 2 and 3 are perspective views of the multipole deflector in accordance with the invention at intermediate stages of manufacture.

Once the bore is of the desired dimensions, the first step in manufacture of the multipole deflector is to machine the outside diameter of the carbon tube 10, for example, on a lathe, from the ends to form a collar 14 in the central portion of the tube, as shown in FIG. 2. The location of this collar is not critical to the practice of the invention but it is preferred that the collar should be formed at a location which will be near the center of the completed device. This collar will be used to form connections to the multiple poles of the completed multipole deflector. The respective connection will thus be of a size which is uniform or proportional to the other dimensions of the respective poles.

Slots 16 are then cut into the sides of the tube and through the collar with a slotting (e.g. circular) saw or the like, as further shown in FIG. 2. These slots do not reach the ends of the tube but leave the ends of the tube intact and in the form of rings 15 which maintain the location of the poles formed by the cutting of the slots. The circumferential locations of the slots are not important to the practice of the invention in accordance with its principles but are dictated by the number, width and locations of the poles to be provided by the multipole deflector and the deflection to be accomplished.

Figure 3:
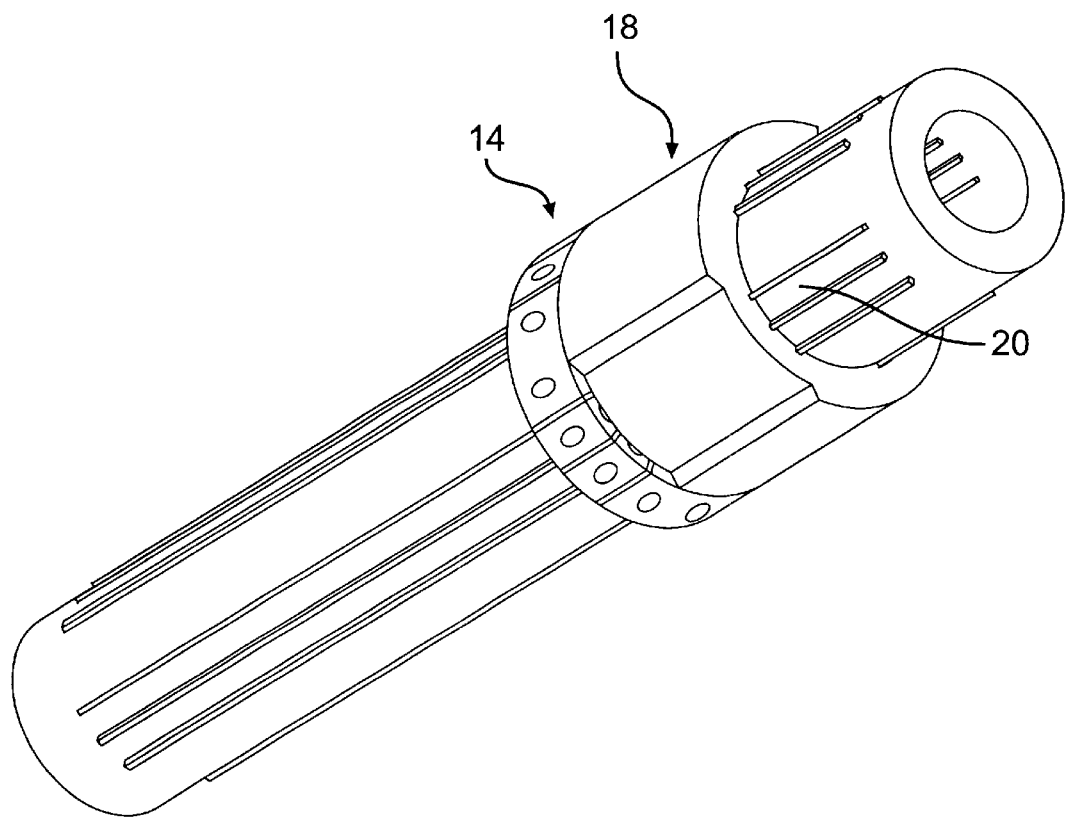

Then, as shown in FIG. 3, an insulating ring 18 is bonded, preferably with epoxy 20, to the exterior of the tube. The bonding material should have good adhesive, insulating and gap-filling properties to support the poles of the deflector and should be able to withstand high vacuum levels without giving off gases that can contaminate the system. The CTE of insulating ring 18 should be as low as possible but is not critical since there are no eddy appreciable eddy currents to produce heating and have sufficient strength and rigidity for mounting the multipole deflector in the charged particle beam column. The shape of the outside surface of the ring is not critical to the practice of the invention but is preferably arranged to facilitate this mounting function. Other functions can also be accommodated, as desired, such as for maintaining locations of wires connected to respective portions of the collar 14. More than one such ring 18 may be bonded to the poles, if desired, such as a further ring located on the opposite side of collar 14 from the ring 18 shown.

Figure 4:
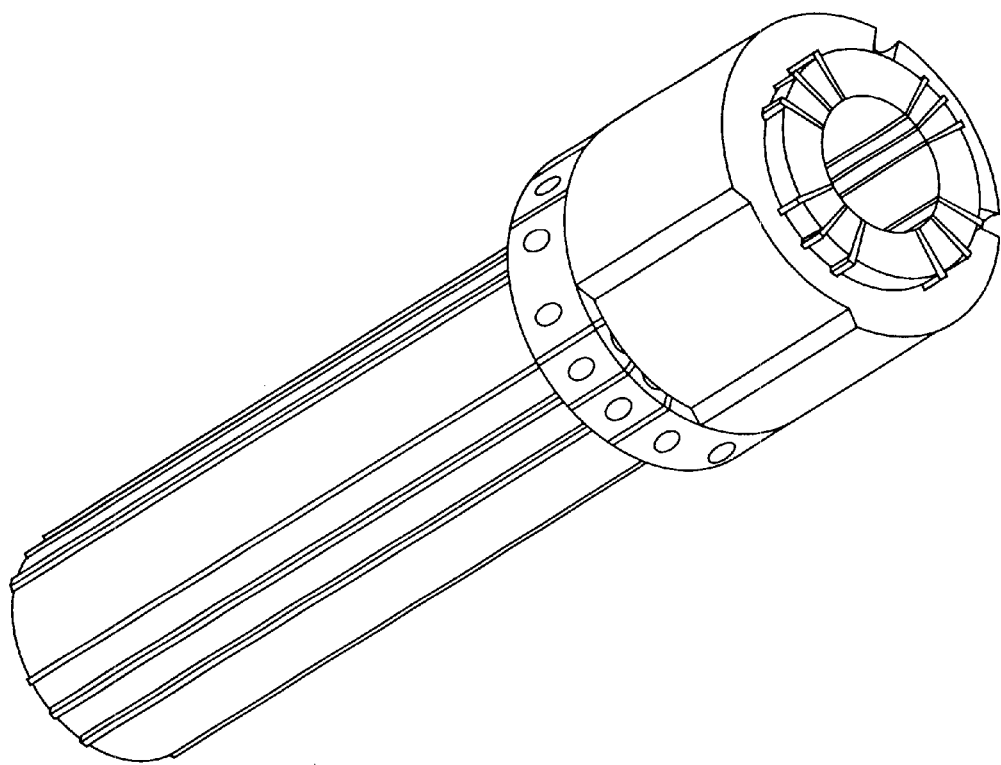
FIG. 4 is a perspective view of the completed multipole deflector in accordance with the invention.

Finally, as shown in FIG. 4, the rings 15 at the ends of the carbon tube 10 are removed, preferably by wire electron discharge machining (EDM), to complete the multipole deflector and leaving the poles formed as separate electrical elements each having the form of a sector of a tube. It is preferred that the ends of the respective poles protrude significantly beyond the ring 18, as shown, to reduce likelihood of charged particles impinging on ring 18 and providing surface charge thereto. However, even if some charging does occur the charged particle beam is shielded therefrom by the poles of the multipole deflector.

It should be noted that no metallization has been required in the manufacture of the multipole deflector in accordance with the invention. While some other materials such as doped semiconductor materials may be suitable for practice of the invention, carbon is much preferred for the bulk material of the multipole deflector in accordance with the invention. The resistivity of carbon is high enough that eddy currents are not developed while the conductivity of carbon is sufficient and the capacitance of the poles formed as discussed above is sufficiently low to support very high speed switching capability and to avoid accumulation of surface charge. Eddy current and RC time constants must be investigated and tailored for each specific application. However, as a rule of thumb, eddy currents will not present a problem if the bulk material resistivity is above 1000 microohm-cm.

Further, while the use of a coating material that does not form non-conductive oxides was critical to the structure of the multipole deflector disclosed in the publication incorporated by reference, above, oxides of carbon are in the form of a relatively stable gas and cannot support surface charging effects. This latter property of carbon should also be considered in the choice of possible alternative materials.

In terms of manufacturing, the conductive properties of carbon avoid the need for separate processes to electrically isolate the poles or to provide ground rings to suppress charging. Therefore, the invention can be somewhat more compact than the previous multipole deflector since the space occupied by the ground ring cannot be used for producing deflection and mechanical support for the poles is provided by the invention within the effective length of the poles and additional material at the ends of the poles is not necessary to maintain them in position. Moreover, the poles may be supported over their entire length in accordance with the invention while, in sharp contrast, the entire operative length of the poles is unsupported by the prior multipole deflector.

The materials of the insulating rings 18 and the bonding material 20 can be freely chosen for strength and other properties discussed above and result in a structure potentially more robust and dimensionally stable than the quartz or ceramic materials previously used. Since there is no conductive coating material required in the invention, there is no trade-off between suppression of eddy currents and conductive coating thickness irregularities and defects.

In view of the foregoing, it is seen that the multipole deflector in accordance with the invention provides a robust and dimensionally stable deflection element which can be reliably and repeatably manufactured by a simplified and economical process with high accuracy and without complex and difficult alignment processes. The invention is also seen to improve virtually every quality (e.g. size, stability, strength, freedom from charging and eddy current effects, freedom from effects due to coating thickness irregularities, reduced capacitance for increased switching speed, reduced cost of manufacture with increased manufacturing yield, and the like) of the prior multipole deflector providing the most nearly optimum performance.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A multipole deflector for a charged particle beam system, said multipole deflector including:

a plurality of poles in the form of sectors of a tube formed from a conductive material having a bulk material resistivity of 100 microohm-cm or greater, said poles being supported by an insulating collar; and a sectored collar forming connections to respective poles of said plurality of poles, respective sectors of said collar being separated by respective slots.

2. A multipoledeflector as recited in claim 1, wherein said insulating collar is adhered to said poles with an adhesive.

3. A multipole deflector as recited in claim 2, wherein said adhesive is epoxy.

4. A charged particle beam tool including:

a multipole deflector element including a plurality of poles in the form of sectors of a tube formed from a conductive material having a bulk material resistivity of 100 microohm-cm or greater; and a sectored collar forming connections to respective poles of said plurality of poles, respective sectors of said collar being separated by respective slots.

5. A charged particle beam tool as recited in claim 4, wherein said collar is adhered to said poles with an adhesive.

6. A charged particle beam tool as recited in claim 5, wherein said adhesive is epoxy.

7. A method of making a multipole deflector element for a charged particle beam tool comprising steps of:

cutting slots in a tube of conductive/resistive material parallel to the axis of said tube thereby forming sectors in the tube, said slots stopping short of the tube length, thereby leaving end rings that support the sectors, bonding a ring of insulating material to said sectors between said end rings, and removing said end rings.

8. A method as recited in claim 7, further including a step of machining of an outer surface of said tube to a desired diameter.

9. A method as recited in claim 8 wherein said machining step is performed by turning on a lathe.

10. A method as recited in claim 8, wherein said machining step includes forming a collar on an outer surface of said tube prior to said cutting step, wherein said cutting step also cuts said collar.

11. A method as recited in claim 9, wherein said machining step includes forming a collar on an outer surface of said tube prior to said cutting step, wherein said cutting step also cuts said collar.

12. A method as recited in claim 7 wherein a bulk resistivity of said conductive/resistive material is 1000 microohm-cm or greater.

* * * * *